(12) United States Patent
Hui

(10) Patent No.: US 8,975,185 B2
(45) Date of Patent: Mar. 10, 2015

(54) FORMING CHARGE TRAP SEPARATION IN A FLASH MEMORY SEMICONDUCTOR DEVICE

(71) Applicant: Spansion LLC, Sunnyvale, CA (US)

(72) Inventor: Angela Tai Hui, Fremont, CA (US)

(73) Assignee: Spansion, LLC, Sunnyvale, CA (US)

( * ) Notice: Subject to any disclaimer, the term of this patent is extended or adjusted under 35 U.S.C. 154(b) by 0 days.

(21) Appl. No.: 13/685,286

(22) Filed: Nov. 26, 2012

(65) Prior Publication Data

US 2014/0148010 A1    May 29, 2014

(51) Int. Cl.
| | | |
|---|---|---|
| *H01L 21/311* | (2006.01) | |
| *H01L 21/28* | (2006.01) | |
| *H01L 29/423* | (2006.01) | |
| *H01L 27/115* | (2006.01) | |

(52) U.S. Cl.
CPC ...... *H01L 21/28282* (2013.01); *H01L 29/4234* (2013.01); *H01L 27/11568* (2013.01)
USPC ........... 438/694; 438/697; 438/710; 438/723; 438/724; 216/57; 216/67

(58) Field of Classification Search
CPC ............... H01L 21/28282; H01L 21/31116; H01L 21/31138; H01L 21/31144; H01L 21/32136; H01L 21/32137
See application file for complete search history.

(56) References Cited

U.S. PATENT DOCUMENTS 7,285,499 B1 * 10/2007 Bell et al. ...................... 438/706
8,035,153 B2    10/2011 Fang et al.
8,273,627 B2    9/2012 Utsuno
2010/0297849 A1    11/2010 Miyake et al.
2011/0195578 A1 *  8/2011 Hui et al. ...................... 438/723

FOREIGN PATENT DOCUMENTS

JP    2009-147237 A    7/2009
KR    10-2010-0081601 A    7/2010
KR    10-2010-0085670 A    7/2010

OTHER PUBLICATIONS

International Search Report and Written Opinion of the International Searching Authority for International Application No. PCT/US2013/071217, mailed Mar. 25, 2014.
English language abstract for Korean patent application publication No. 10-2010-0081601 A.
English language abstract for Korean patent application publication No. 10-2010-0085670 A.

* cited by examiner

*Primary Examiner* — Lan Vinh
*Assistant Examiner* — Jiong-Ping Lu
(74) *Attorney, Agent, or Firm* — Sterne, Kessler, Goldstein & Fox PLLC

(57) ABSTRACT

During formation of a charge trap separation in a semiconductor device, a polymer deposition is formed in a reactor using a first chemistry. In a following step, a second chemistry can be used to etch the polymer deposition in the reactor. The same or similar second chemistry can be used in a second etching step to expose a first oxide layer in each of the cells of the semiconductor device and to form a flat upper surface. This additional etch step can also be performed by the reactor, thereby reducing the number of machines required in the formation process.

12 Claims, 4 Drawing Sheets

FORMING CHARGE TRAP SEPARATION IN A FLASH MEMORY SEMICONDUCTOR DEVICE

BACKGROUND

1. Technical Field

The disclosure generally relates to forming a charge trap separation in a semiconductor device, and specifically to reducing the number of different machines needed to perform the formation process.

2. Related Art

Charge trap semiconductors have become commercially viable for use in flash memory devices. Charge trap semiconductor configurations provide significant advantages over other configurations by allowing multiple bits to be stored in each individual cell. However, the manufacturing of charge trap semiconductors can be somewhat time-consuming and complex.

Conventionally, several different machines are used to construct charge trap semiconductors for flash memories. For example, charge trap layers are grown on top of source/drain regions and field oxide regions of a base substrate using one or more first machines, such as a PECVD furnace. A second machine, such as track equipment, is then used to coat a thin organic material above the charge trap layers in order to fill gaps and planarize the surface of the semiconductor using a coating and/or spinning process. A third machine, such as an etcher, is then used to etch back the organic material and remove the exposed charge trap layers in order to create the separate cells of the final semiconductor device.

The need to move the semiconductor between different machines during the conventional manufacturing process greatly increases manufacturing time. In addition, the movements between different machines increase the likelihood of contaminating the semiconductor wafer, and therefore potentially decreases manufacturing yield.

BRIEF DESCRIPTION OF THE DRAWINGS/FIGURES

Embodiments are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION

Figure 1A:
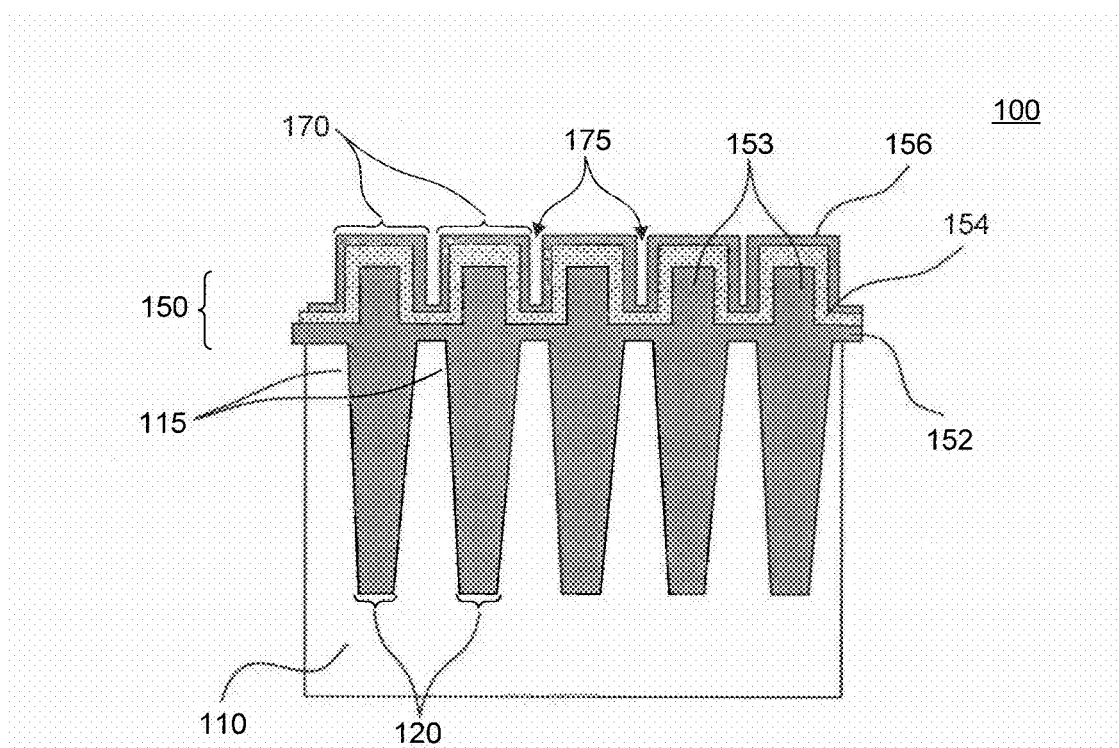
FIGS. 1A-1D illustrate side views of a semiconductor device during manufacturing method steps for forming a charge trap separation according to an embodiment.

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the invention. Rather, the scope of the invention is defined only in accordance with the following claims and their equivalents.

Method embodiments may be implemented in hardware circuits), firmware, software, or any combination thereof. Method embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable, medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various semiconductor devices, and should not he limited to flash memory devices or any other particular type of semiconductor devices.

An Exemplary Semiconductor Device

FIG. 1A illustrates a side view of an exemplary semiconductor device 100 prior to charge trap separation according to an embodiment.

The semiconductor device 100 includes a bulk semiconductor substrate 110 that includes a plurality of source/drain regions 115 extending vertically from a base of the substrate 110. Adjacent vertically-extending source/drain regions 115 define isolation trenches 120 therebetween.

Charge trap layers 150 are formed over a top surface of the substrate 110. The charge trap layers 150 include a first oxide layer 152 that extends into the isolation trenches 120, and which covers a top surface of the substrate 110. The first oxide layer 152 includes substantially rectangular protrusions 153 that extend above the isolation trenches 120. The charge trap layers 150 further include a silicon rich nitride layer 154 uniformly formed over the first oxide layer 152, as well as a second oxide layer 156 uniformly formed over the silicon rich nitride layer 154.

The combined first oxide layer 152, silicon rich nitride layer 154 and second oxide layer 156 define cells 170 at each of the rectangular protrusions 153. Adjacent cells 170 are separated from one another by, and together define, cell separation gaps 175.

Figure 1B:
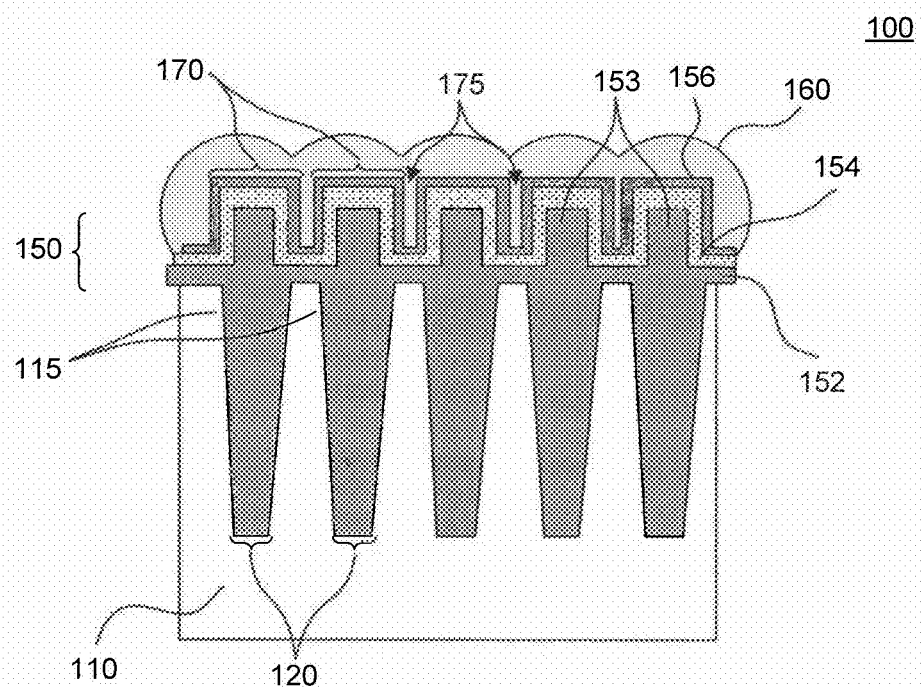

FIG. 1B illustrates a side view of the semiconductor device 100 after a subsequent step in an exemplary charge trap separation formation method, according to an embodiment.

In an embodiment, in this step, the semiconductor device 100 is placed in a reactor. In an embodiment, the reactor is a plasma reactor. The reactor is used to grow a polymer deposition 160 over a top surface of the semiconductor device 100, and specifically over the second oxide layer 156 of the charge trap layers 150.

The polymer deposition 160 is formed so as to at least substantially fill the cell separation gaps 175. Particularly, the polymer deposition 160 may be formed within the cell separation gaps 175 sufficiently high such that a future etching step (See FIG. 1D) leaves cell separation gaps 175 completely filled with the polymer deposition 160. Therefore, in an embodiment, in order to ensure sufficient polymer deposition 160, the polymer deposition 160 is formed so as to at least completely fill the cell separation gaps 175.

In an embodiment, in order to grow the polymer deposition 160 on the semiconductor device 100, the reactor employs a chemistry (e.g., a "grow chemistry") selected from a plurality of hydrocarbon gases and/or fluorocarbon gases. Such chemistries may include, for example, HBr, $CH_4$, $CH_3F$ and $CH2F2$. Other viable chemistries may include $C_xH_yF_z$, where x, y, and z are each positive integers.

Figure 1C:
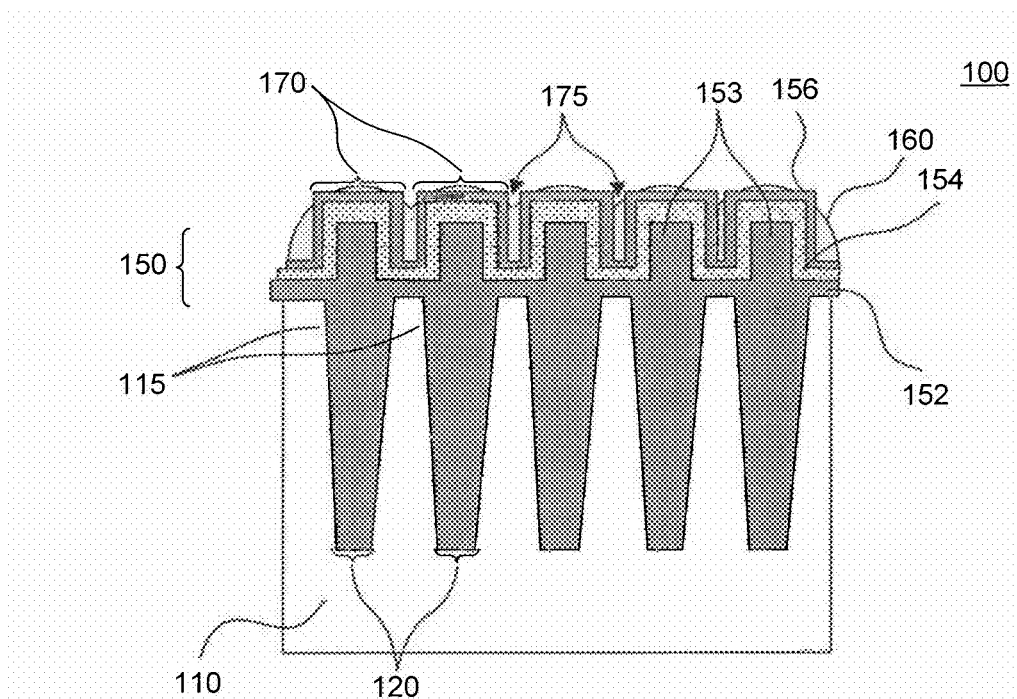

FIG. 1C illustrates a side view of the semiconductor device 100 after a subsequent step in the exemplary charge trap separation formation method, according to an embodiment.

According to an embodiment, in this step, using the same reactor, the semiconductor device 100 is etched using a different chemistry. For example, in this step the chemistry in the reactor is changed to an etch chemistry, such as a $CF_4/O_2$ mixture. With this new etch chemistry, the reactor etches away outer portions of the polymer deposition 160 in order to expose the upper edges of the charge trap layers 150.

In an embodiment, this etching step etches the polymer deposition 160 below the top surface of the charge trap layers 150, provided that the polymer deposition 160 still sufficiently fills the cell separation gaps 175 so as to completely fill those gaps 175 after a second subsequent etch (see FIG. 1D).

Figure 1D:
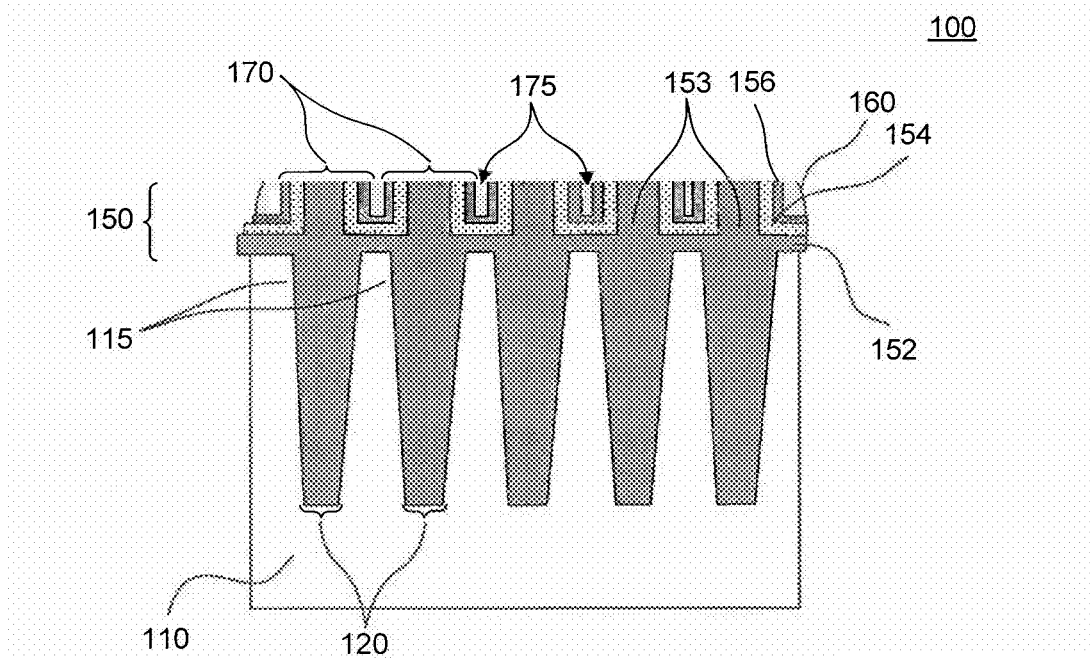

FIG. 1D illustrates a side view of the semiconductor device 100 after a subsequent step in the exemplary charge trap separation formation method, according to an embodiment.

In an embodiment, using the same reactor, the semiconductor device 100 is further etched in order to expose upper edges of the first oxide layer 152. In order to expose the first oxide layer 152, the reactor etches the polymer deposition 160 together with a portion of the second oxide layer 156 and silicon nitride layer 154 over each of the cells 170. By performing the first etch (FIG. 1C) to maintain the polymer deposition 160 in the cell separation gaps 175, the polymer deposition 160 protects the active regions of the semiconductor device 100 during this second etch.

As a result of this second etch, the semiconductor device 100 includes a plurality of separate cells 170 separated from each other by the polymer deposition 160 filled into the cell separation gaps 175. In addition, the semiconductor device 100 maintains a substantially flat upper surface as a result of the second etch.

By forming the charge trap separation in the manner described above, only a single machine is required for the growing and etching steps. This substantially reduces manufacturing costs, time and complexity. In addition, by maintaining the semiconductor device 100 in a single machine throughout the charge trap separation formation process, the likelihood of contracting contaminants is reduced. Consequently, manufacturing yield and efficiency can be improved over conventional methods.

Exemplary Method for Forming Charge Trap Separation in a Semiconductor Device

Figure 2:
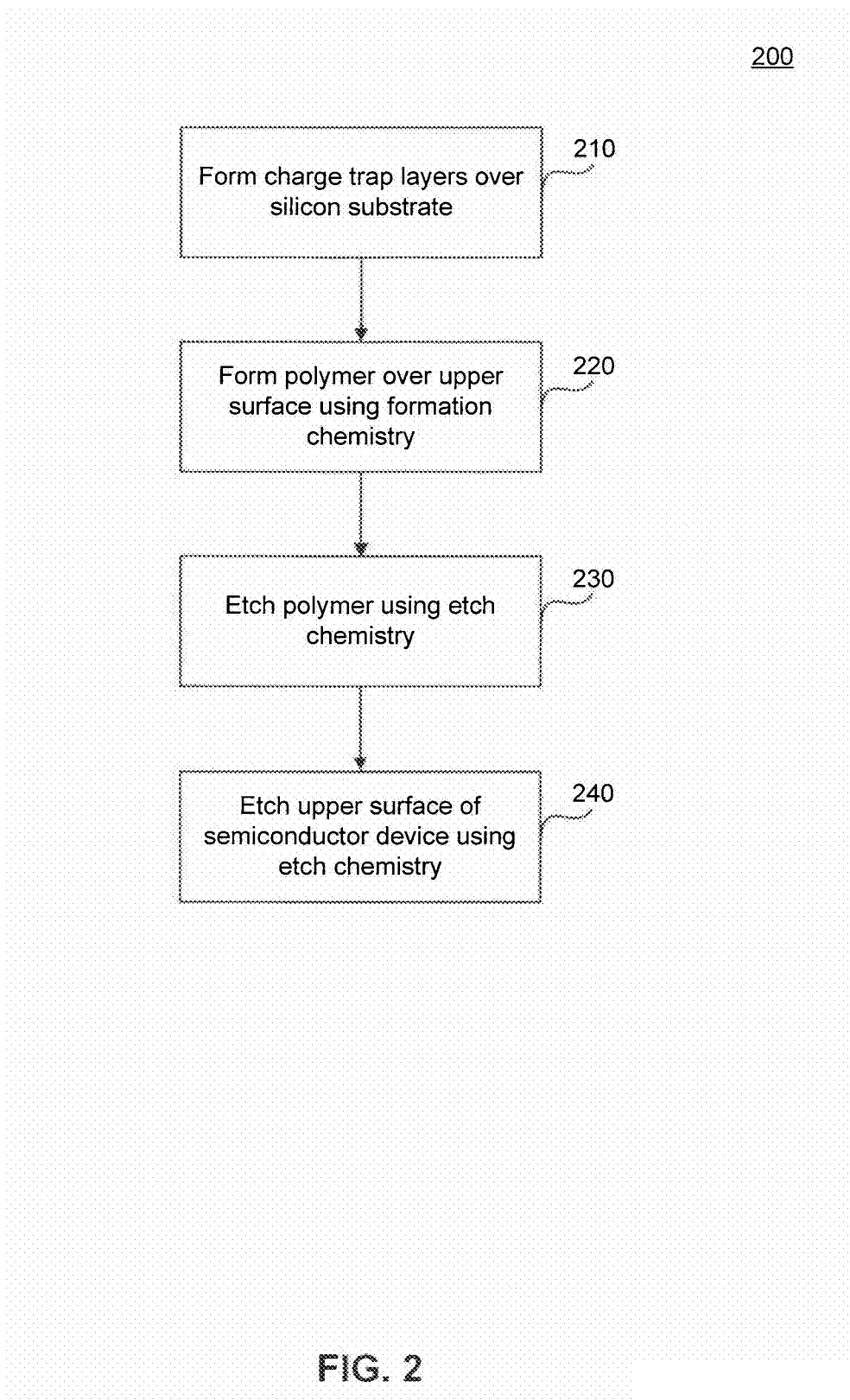
FIG. 2 illustrates a flowchart of a method for forming a charge trap separation in a flash memory semiconductor device according to an embodiment.

FIG. 2 illustrates a flowchart diagram 200 of a method for forming a charge trap separation in a flash memory semiconductor device according to an embodiment. For illustration purposes, flowchart 200 is described with continued reference to FIGS. 1A-1D, although the method 200 is not limited to the example.

In step 210, referring to FIG. 1A, charge trap layers 150 are formed over a top surface of a substrate 110. The charge trap layers 150 include a first oxide layer 152 that extends into isolation trenches 120 defined by vertically-extending source/drain regions 115 of the substrate 110. The first oxide layer 152 includes substantially rectangular protrusions 153 that extend above the isolation trenches 120. The charge trap layers 150 further include a silicon rich nitride layer 154 uniformly formed over the first oxide layer 152, as well as a second oxide layer 156 uniformly formed over the silicon rich nitride layer 154.

In step 220, referring to FIG. 1B, in a reactor, a polymer deposition 160 is formed on a top surface of the semiconductor device 100. The polymer deposition 160 can be formed using a formation chemistry using hydrocarbon gases and/or fluorocarbon gases, such as those described above, although the method 200 is not limited to such examples. The polymer deposition 160 is formed so as to at least substantially fill cell separation gaps 175 defined by adjacent cells 170 of the semiconductor device 100.

In step 230, referring to FIG. 1C, in the same reactor, the polymer deposition 160 is etched using an etch chemistry. The etch chemistry may include a mixture of $CF_4$ and $O_2$ (although the method 200 is not limited to these examples), and should etch the polymer deposition 160 to expose a top surface of the charge trap layers 150 without significantly removing the polymer deposition 160 from the cell separation gaps 175.

In step 240, referring to FIG. 1D, in the same reactor, the upper surface of the semiconductor 100 is etched using the etch chemistry. This second etch removes portions of the second oxide layer 156 and portions of the silicon rich nitride layer 154 so as to expose the first oxide layer 152 at each of the cells 170 of the semiconductor device 100. In addition, the second etch removes portions of the polymer deposition 160 so as to maintain a substantially flat top surface in the resulting semiconductor device 100. In an embodiment, the reactor is a plasma reactor. Also, in certain embodiments, more than one device (reactors) may be used to perform these steps of flowchart 200.

Those skilled in the relevant art(s) will recognize that the above method can additionally or alternatively include any of the steps or substeps described above with respect to FIGS. 1A-1D, as well as any of their modifications. Further, the above description of the exemplary method should not be construed to limit the description of the method depicted in FIGS. 1A-1D.

Figure 3:
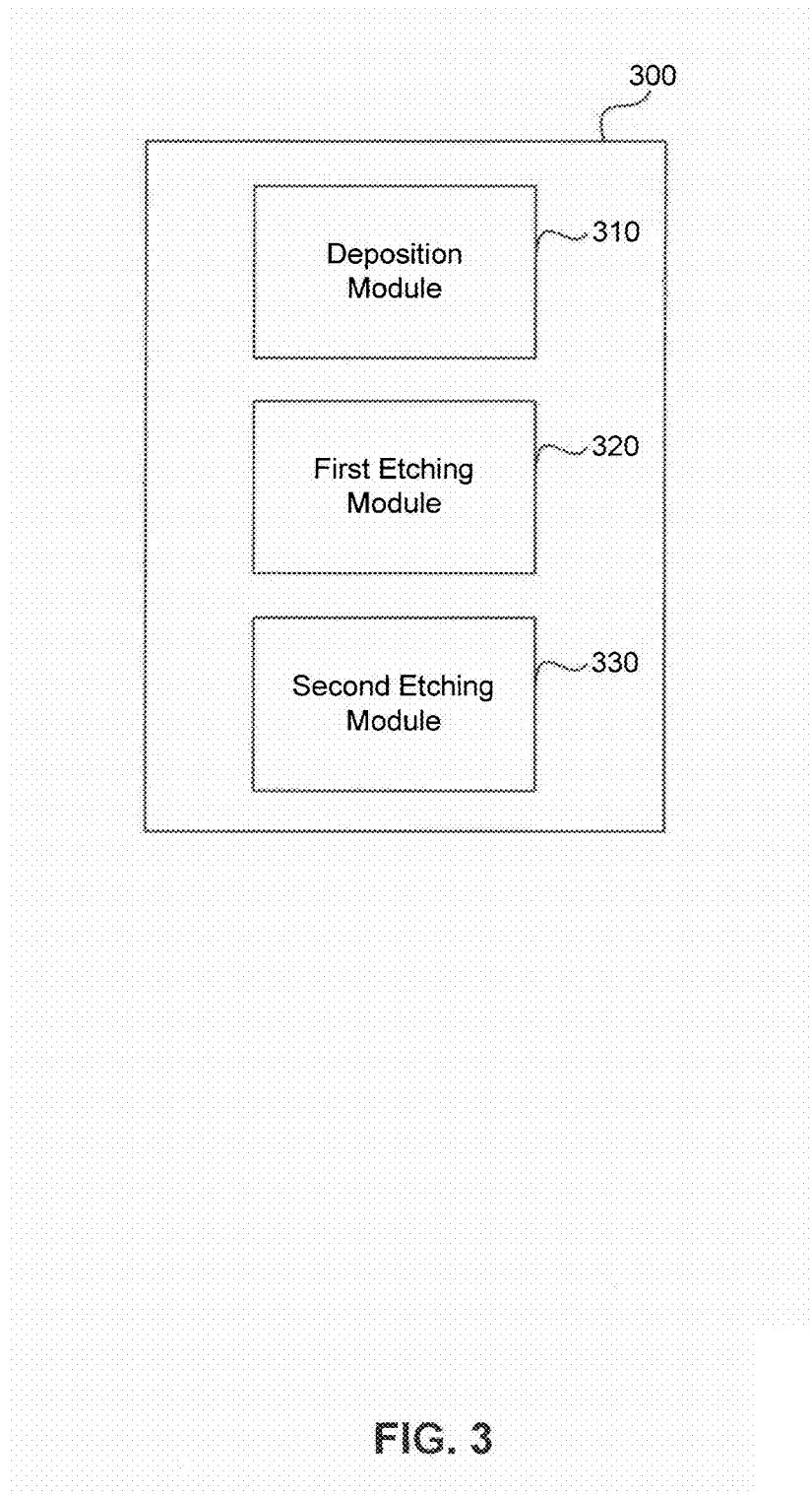
FIG. 3 illustrates a block diagram of an apparatus configured to form a charge trap separation in a flash memory semiconductor device according to an embodiment.

Exemplary Apparatus for Forming Charge Trap Separation in a Semiconductor Device FIG. 3 illustrates a block diagram of an exemplary apparatus 300 for forming charge trap separation in a semiconductor device. The apparatus includes a deposition module 310, a first etching module 320 and a second etching module 330. For illustration purposes, the apparatus 300 is described with continued reference to FIGS. 1A-1D.

The apparatus 300 forms charge trap separation in a semiconductor device 100 having charge trap layers 150 formed over a top surface of a substrate 110, as shown for example in FIG. 1A. The charge trap layers 150 include a first oxide layer 152 that extends into isolation trenches 120 defined by vertically-extending source/drain regions 115 of the substrate 110. The first oxide layer 152 includes substantially rectangular protrusions 153 that extend above the isolation trenches 120. The charge trap layers 150 further include a silicon rich nitride layer 154 uniformly formed over the first oxide layer 152, as well as a second oxide layer 156 uniformly formed over the silicon rich nitride layer 154.

The deposition module 310 is configured to form a polymer deposition 160 on a top surface of the semiconductor device 100, as shown for example in FIG. 1B. The polymer deposition 160 can be formed using a formation chemistry using for example and without limitation hydrocarbon gases and/or fluorocarbon gases, such as those described above. The polymer deposition 160 is formed so as to at least substantially fill cell separation gaps 175 defined by adjacent cells 170 of the semiconductor device 100.

The first etching module 320 is configured to etch the polymer deposition 160 using an etch chemistry, as shown for example in FIG. 1C. The etch chemistry may include, but is not limited to, a mixture of $CF_4$ and $O_2$, and should etch the polymer deposition 160 to expose a top surface of the charge trap layers 150 without significantly removing the polymer deposition 160 from the cell separation gaps 175.

The second etching module 330 is configured to etch the upper surface of the semiconductor 100 using the etch chemistry, as shown for example in FIG. 1D. This second etch removes portions of the second oxide layer 156 and portions of the silicon rich nitride layer 154 so as to expose the first oxide layer 152 at each of the cells 170 of the semiconductor device 100. In addition, the second etch removes portions of the polymer deposition 160 so as to maintain a substantially flat top surface in the resulting semiconductor device 100. In an embodiment, the apparatus 300 is a plasma reactor.

Those skilled in the relevant art(s) will recognize that the above method can additionally or alternatively include any of the steps or substeps described above with respect to FIGS. 1A-1D, as well as any of their modifications. Further, the above description of the exemplary method should not be construed to limit the description of the method depicted in FIGS. 1A-1D.

CONCLUSION

It is to be appreciated that the Detailed Description section, and not the Abstract section, is intended to be used to interpret the claims. The Abstract section may set forth one or more, but not all exemplary embodiments, and thus, is not intended to limit the disclosure and the appended claims in any way.

The invention has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus, the invention should not be limited by any of the above-described exemplary embodiments, but should be defined only in accordance with the following claims and their equivalents.

What is claimed is:

1. A method of forming charge trap separation in a semiconductor device, the semiconductor device having a charge trap layer formed on a substrate, the method comprising:
   in a single reactor:
      growing a polymer deposition on the charge trap layer so as to fill cell separation gaps between adjacent cells of the charge trap layer;
      first etching the polymer deposition to expose the charge trap layer such that an upper surface of the polymer deposition is lower than an upper surface of the charge trap layer; and
      second etching the polymer deposition over the cells and within the cell separation gaps together with the charge trap layer so as to expose a bottom portion of the charge trap layer within the cells and form a uniform upper surface among the cells and the cell separation gaps.

2. The method of claim 1, wherein the growing is performed using a grow chemistry, and
   wherein at least one of the first etching and the second etching is performed using an etch chemistry different from the grow chemistry.

3. The method of claim 2, wherein both the first etching and the second etching are performed using the etch chemistry.

4. The method of claim 2, wherein the grow chemistry includes at least one of a hydrocarbon gas and a fluorocarbon gas.

5. The method of claim 2, wherein the etch chemistry includes a mixture of $CF_4$ and $O_2$.

6. The method of claim 1, wherein the first etching removes a portion of the polymer deposition from within the cell separation gaps.

7. A method of forming a charge trap separation in a semiconductor device, the semiconductor device including a charge trap layer formed over a substrate, the charge trap layer including a plurality of protrusions separated by cell separation gaps, the method comprising:
   growing a polymer deposition over the charge trap layer;
   first etching the polymer deposition such that an upper surface of the polymer deposition is lower than an upper surface of the charge trap layer; and
   second etching the polymer deposition within the cell separation gaps and over cells defined by the cell separation gaps so as to form a uniform upper surface among the cells and the cell separation gaps,
   wherein the growing and the etching are performed in a same machine.

8. The method of claim 7, wherein the etching includes a first etching and a second etching.

9. The method of claim 8, wherein the first etching includes etching only the polymer deposition, and
   wherein the second etching includes etching both the polymer deposition and the charge trap layer.

10. The method of claim 9, wherein the first etching etches the polymer deposition to a level at or below an upper surface of the charge trap layer.

11. The method of claim 7, wherein the growing is performed using a first chemistry, and
wherein the etching is performed using a second chemistry.

12. The method of claim 11, wherein the machine is a plasma reactor.

* * * * *